(12) United States Patent
Shih et al.

(10) Patent No.: US 9,997,524 B2
(45) Date of Patent: Jun. 12, 2018

(54) SEMICONDUCTOR MEMORY DEVICE AND MANUFACTURING METHOD THEREOF

(71) Applicant: TAIWAN SEMICONDUCTOR MANUFACTURING CO., LTD., Hsinchu (TW)

(72) Inventors: Hung-Ling Shih, Tainan (TW); Chieh-Fei Chiu, Tainan (TW); Po-Wei Liu, Tainan (TW); Tsun-Kai Tsao, Tainan (TW); Wen-Tuo Huang, Tainan (TW); Yu-Ling Hsu, Tainan (TW); Yong-Shiuan Tsair, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/272,067

(22) Filed: Sep. 21, 2016

(65) Prior Publication Data

US 2018/0061847 A1    Mar. 1, 2018

Related U.S. Application Data

(60) Provisional application No. 62/378,908, filed on Aug. 24, 2016.

(51) Int. Cl.
*H01L 29/788* (2006.01)
*H01L 27/11521* (2017.01)

(52) U.S. Cl.
CPC ............................ *H01L 27/11521* (2013.01)

(58) Field of Classification Search
None
See application file for complete search history.

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

*Primary Examiner* — Sitaramarao S Yechuri
(74) *Attorney, Agent, or Firm* — McDermott Will & Emery LLP

(57) ABSTRACT

A memory device includes a substrate. An insulation layer is disposed in a recess in the substrate. A first gate structure is disposed over the substrate and the insulation layer. A first etch stop layer is disposed over the first gate structure. A first oxide layer is disposed over the first etch stop layer. A second etch stop layer is disposed over the first oxide layer. A first contact material is surrounded by and in contact with the first gate structure, first etch stop layer, second etch stop layer, and first oxide layer.

20 Claims, 13 Drawing Sheets

(56) References Cited

U.S. PATENT DOCUMENTS

| | | | |
|---|---|---|---|
| 2003/0134473 A1* | 7/2003 | Sung | H01L 27/115 |
| | | | 438/257 |
| 2010/0054043 A1* | 3/2010 | Liu | H01L 21/28273 |
| | | | 365/185.29 |
| 2010/0140686 A1* | 6/2010 | Arizono | H01L 21/28273 |
| | | | 257/324 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0236030 A1* | 8/2015 | Wu | H01L 27/11521 |
| | | | 257/316 |

* cited by examiner

SEMICONDUCTOR MEMORY DEVICE AND MANUFACTURING METHOD THEREOF

CROSS-REFERENCE TO RELATED APPLICATION

This application claims the benefit of priority to U.S. Provisional Application No. 62/378,908, entitled "SEMICONDUCTOR MEMORY DEVICE AND MANUFACTURING METHOD THEREOF," filed Aug. 24, 2016, which is incorporated herein by reference in its entirety.

TECHNICAL FIELD

The disclosure relates to a semiconductor device, more particularly to a semiconductor memory device and its manufacturing process.

BACKGROUND

Flash memories have become increasingly popular in recent years. A typical flash memory includes a memory array having a large number of memory cells arranged as an array. Each of the memory cells may be fabricated as a field-effect transistor having a control gate (CG) and a floating gate (FG). The floating gate is capable of holding charges, and is separated from source and drain regions contained in a substrate by a layer of thin oxide. Each of the memory cells may be electrically charged by injecting electrons from the substrate into the floating gate. The charges may be removed from the floating gate by tunneling the electrons to the source region or an erase gate during an erase operation. The data in flash memory cells may thus be determined by the presence or absence of charges in the floating gates.

As the semiconductor industry introduces new generations of integrated circuits (ICs) having higher performance and greater functionality, cost reduction pressure becomes stronger. In particular, reducing a number of operations, such as lithography operations, has become desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
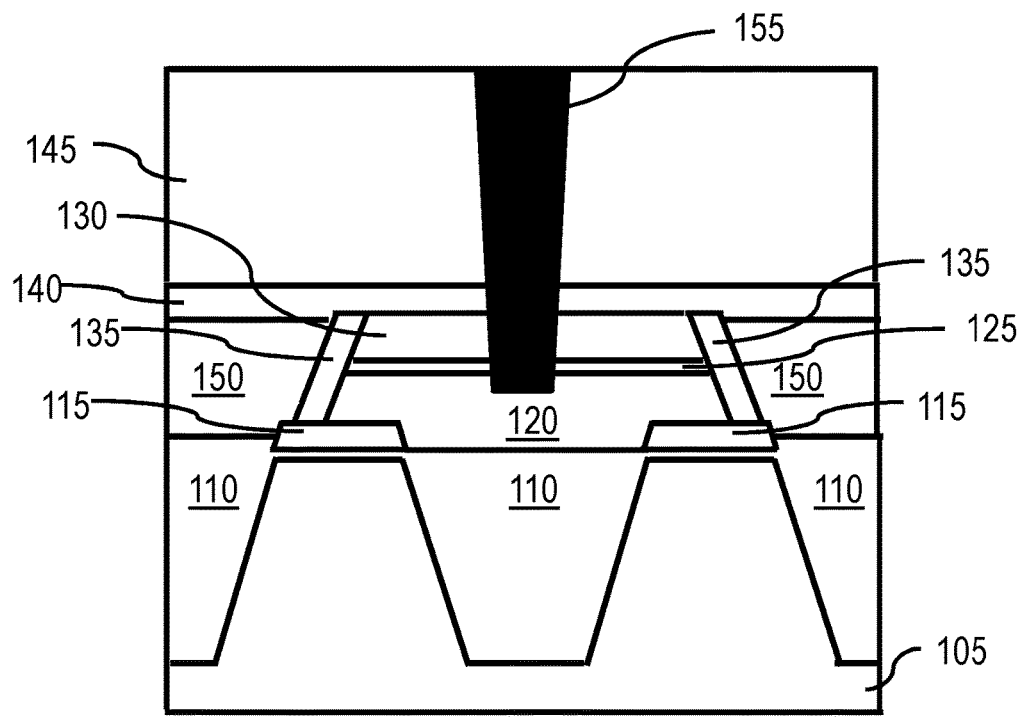
FIGS. 1A and 1B are cross-sectional views of a flash memory cell taken on a control gate (CG) site and a common source (CS) site, respectively, according to embodiments of the present disclosure.
Figure 1B:
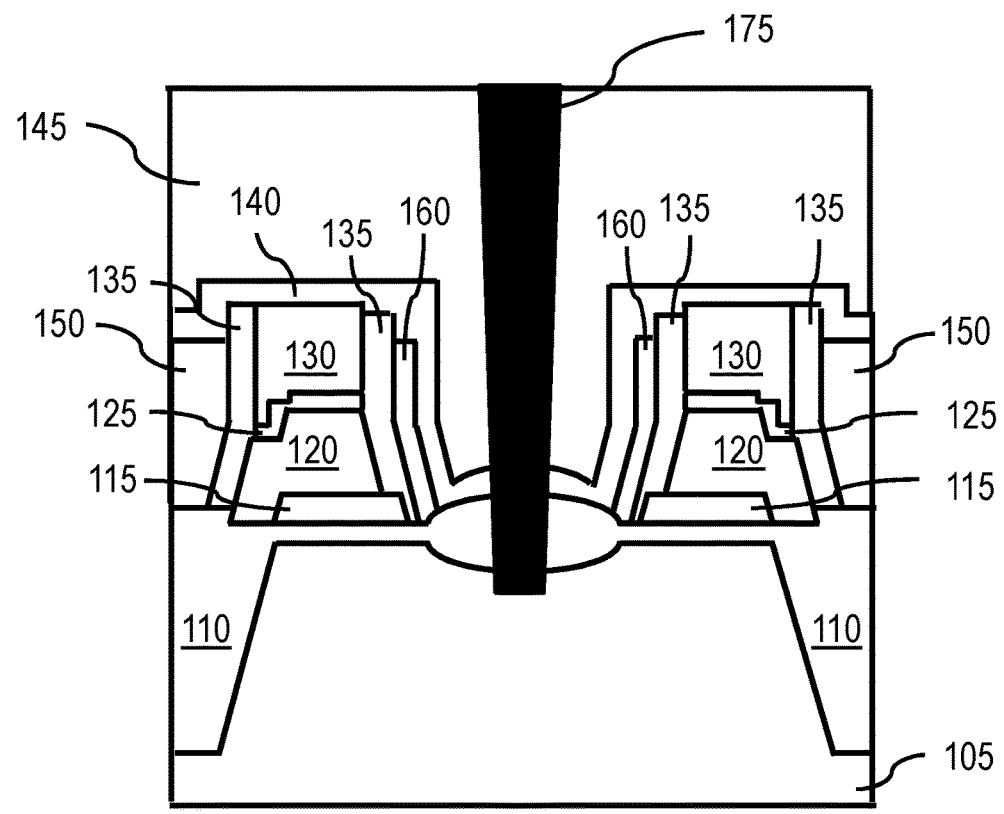

FIGS. 1A and 1B are cross-sectional views of a flash memory cell taken on a control gate (CG) site and a common source (CS) site, respectively, according to embodiments of the present disclosure. As shown in FIGS. 1A and 1B, the flash memory cell includes a substrate 105, insulation layer 110, floating gates (FGs) 115, control gates (CGs) 120, first etch stop layer (ESL) 125, resist protective oxide (RPO) layer 130, first spacer layers 135, second etch stop layer 140, interlayer dielectric (ILD) layer 145, wordlines 150, first contact 155, second spacer layer 160, and second contact 175.

FIGS. 2-25 are cross-sectional views illustrating a method of manufacturing a flash memory cell according to embodiments of the present disclosure. The cross-sectional views in FIGS. 2, 4, 6, 8, 10, 12, 14, 16, 18, 20, 22, and 24 are taken on the control gate site. The cross-sectional views in FIGS. 3, 5, 7, 9, 11, 13, 15, 17, 19, 21, 23, and 25 are taken on the common source site.

Figure 2:
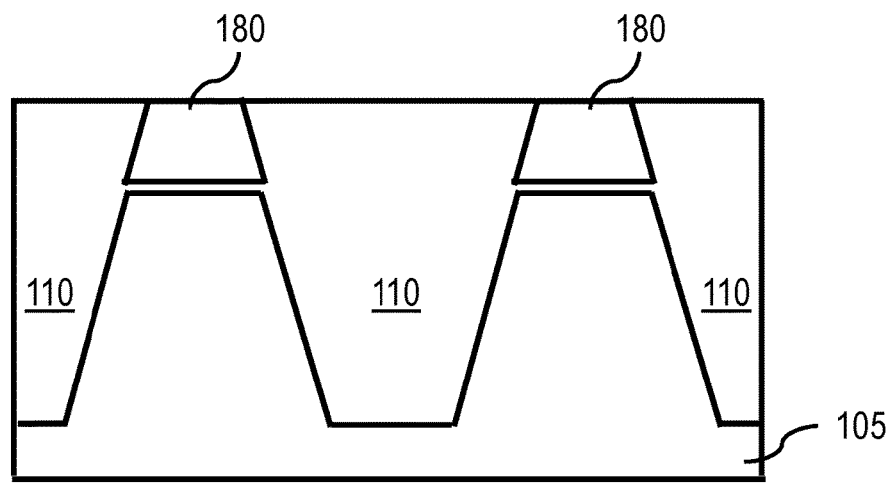
FIGS. 2-25 are cross-sectional views illustrating a method of manufacturing a flash memory cell according to embodiments of the present disclosure.
Figure 3:
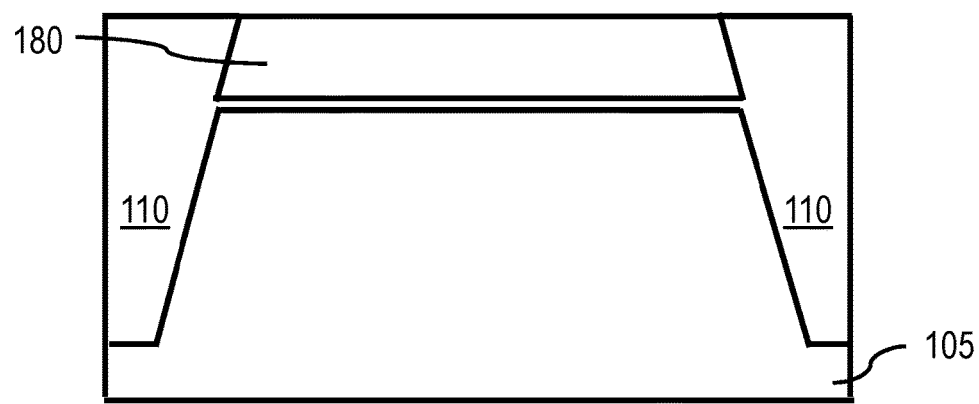

As shown in FIGS. 2 and 3, a semiconductor structure includes the substrate 105, the insulation layer 110, and a first hard mask layer 180 surrounded by the insulation layer 110. The substrate 105 may be a silicon substrate or a silicon-on-insulator (SOI) substrate. Alternatively, in some embodiments, the substrate 105 uses other semiconductor materials, such as diamond, silicon carbide, germanium, silicon germanium, gallium arsenide, gallium arsenide phosphide (GaAsP), aluminum indium arsenide (AlInAs), aluminum gallium arsenide (AlGaAs), gallium indium phosphide (GaInP), or combinations thereof.

A portion of the insulation layer 110 may be between the substrate 105 and first hard mask layer 180. The first hard mask layer 180 may include silicon oxide, silicon nitride, silicon carbide, silicon oxynitride, aluminum oxide, aluminum nitride, aluminum fluoride, titanium nitride, tantalum oxide, magnesium fluoride, titanium silicon nitride, or other suitable hard mask materials.

The insulation layer 110 may be formed as part of a shallow trench isolation (STI) operation. The insulation layer 110 may include one or more layers of insulating material. Each layer of insulating material may include, for example, silicon oxide, silicon dioxide, silicon nitride, silicon oxynitride (SiON), silicon oxycarbonitride (SiOCN), fluorine-doped silicate glass (FSG), or a low-k dielectric material. The insulation layer 110 may be formed using a chemical vapor deposition (CVD) operation, such as a low pressure chemical vapor deposition (LPCVD) operation, a plasma-enhanced chemical vapor deposition (PECVD) operation, a flowable chemical vapor deposition operation, a molecular layer deposition (MLD) operation, and combinations thereof, among others. In some embodiments, the insulation layer 110 is formed by forming trenches/recesses in a bulk substrate material, forming insulation material (e.g., using a CVD operation) within and over the trenches/recesses, and performing a chemical mechanical polishing (CMP) operation on the insulation material to form the insulation layer 110 within the trenches/recesses.

Figure 4:
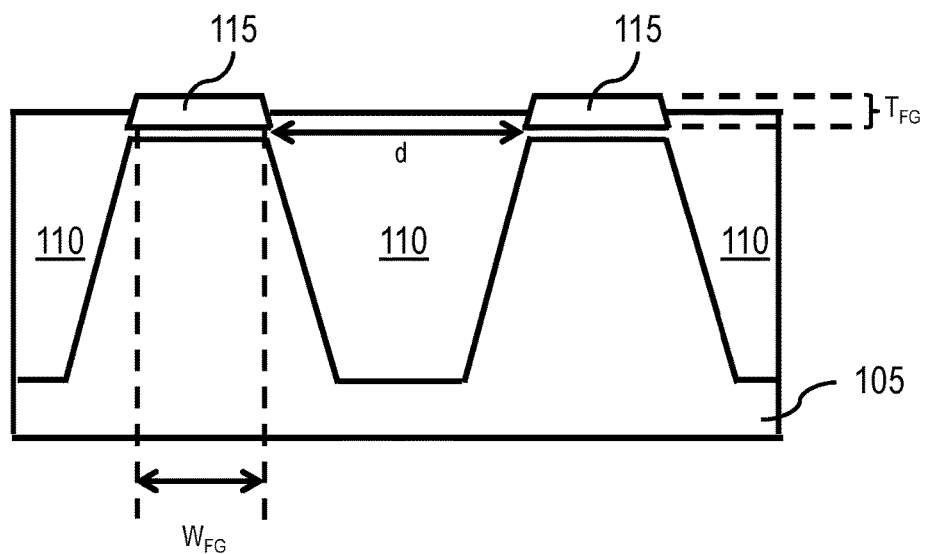
Figure 5:
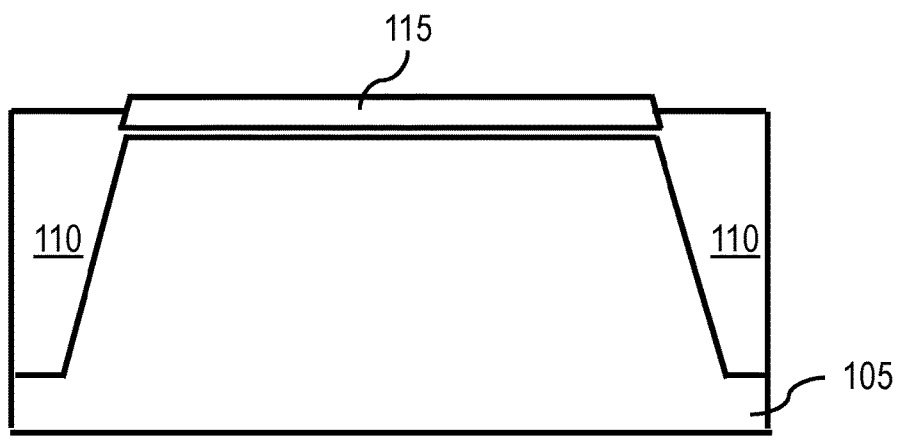

In FIGS. 4 and 5, the first hard mask layers 180 are removed (e.g., by etching operations) and the floating gates 115 are formed on the insulation layer 110. In some embodiments, etching operations performed on the first hard mask layers 180 etch a portion of the insulation layer 110. The floating gates 115 may be formed by performing a deposition operation to deposit floating gate material on the insulation layer 110 followed by a patterning operation and a chemical mechanical polishing operation on the deposited floating gate material to a desired thickness $T_{FG}$. The thickness $T_{FG}$ of the floating gates 115 may be between about 24 nm and about 30 nm. A width $W_{FG}$ of the floating gates 115 may be between about 40 nm and about 60 nm. A distance d between the adjacent floating gates 115 may be between about 110 nm and about 170 nm.

The floating gates 115 may include conductive material. In some embodiments, the floating gates 115 include polysilicon, doped polysilicon, or combinations thereof. In some embodiments, the floating gates 115, when formed, are implanted with a p-type or an n-type impurity, followed by an anneal operation to activate the implanted impurity.

Figure 6:
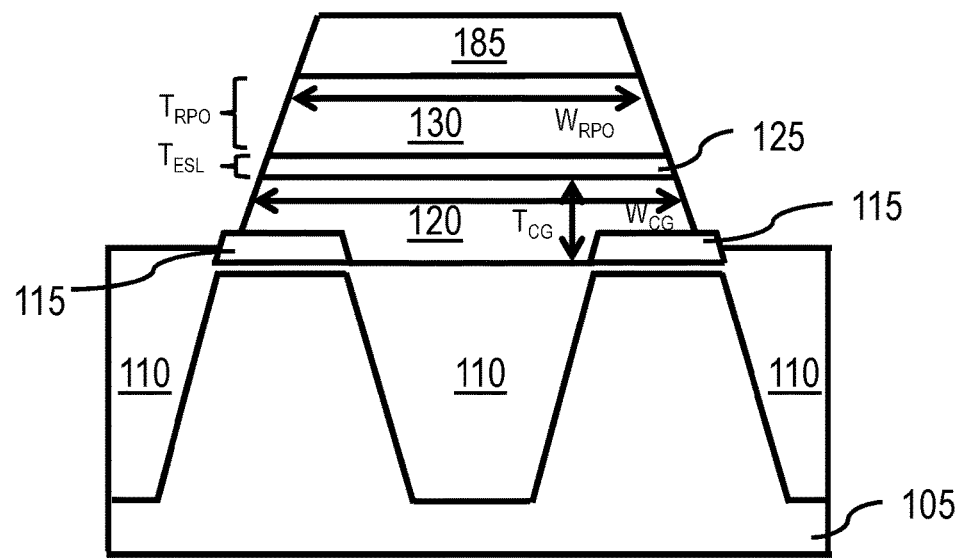
Figure 7:
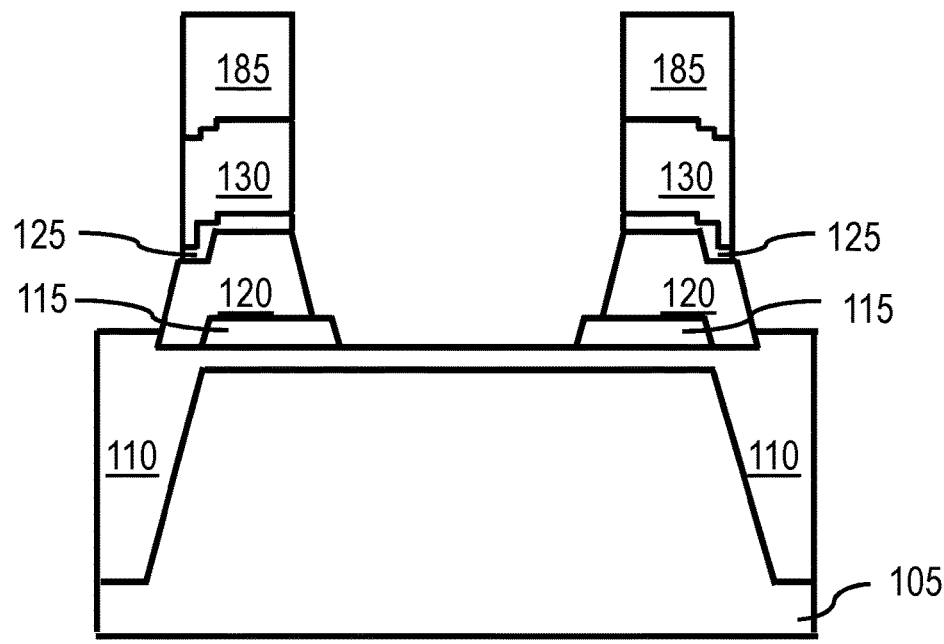

In FIGS. 6 and 7, the control gates 120, first etch stop layer 125, and resist protective layer 130 are formed. The control gates 120 are disposed over the insulation layer 110 and floating gates 115. The control gates 120 may be formed by performing a deposition operation to deposit floating gate material on the insulation layer 110 followed by a patterning operation and a chemical mechanical polishing operation on the deposited control gate material. A thickness $T_{CG}$ of the control gates 120 may be between about 55 nm and about 85 nm. A width $W_{CG}$ of the control gates 120 may be between about 100 nm and about 270 nm. In some embodiments, a second hard mask layer 185 is formed over the resist protective layer 130. The second hard mask layer 185 may include materials such as silicon nitride, silicon dioxide, or combinations thereof.

The first etch stop layer 125 may be disposed over the control gates 120. A thickness $T_{ESL}$ of the first etch stop layer 125 may be between about 4 nm and about 8 nm. The first etch stop layer 125 may include silicon oxide, silicon nitride, silicon carbide, silicon oxynitride, aluminum oxide, aluminum nitride, aluminum fluoride, titanium nitride, tantalum oxide, magnesium fluoride, titanium silicon nitride, or other suitable etch-stop materials. The resist protective oxide layer 130 may be disposed over the first etch stop layer 125. A thickness $T_{RPO}$ of the resist protective oxide layer 130 may be between about 35 nm and about 55 nm. A width $W_{RPO}$ of the resist protective oxide layer 130 may be between about 160 nm and about 240 nm.

The control gates 120 may include conductive material. In some embodiments, the control gates 120 include polysilicon, doped polysilicon, or combinations thereof. In some embodiments, the control gates 120, when formed, are implanted with a p-type or an n-type impurity, followed by an anneal operation to activate the implanted impurity.

Figure 8:
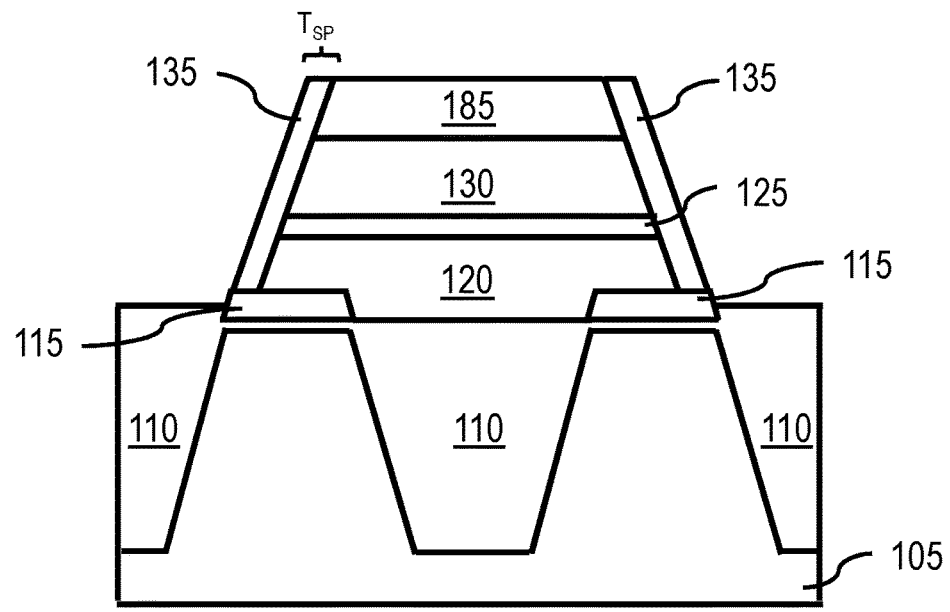
Figure 9:
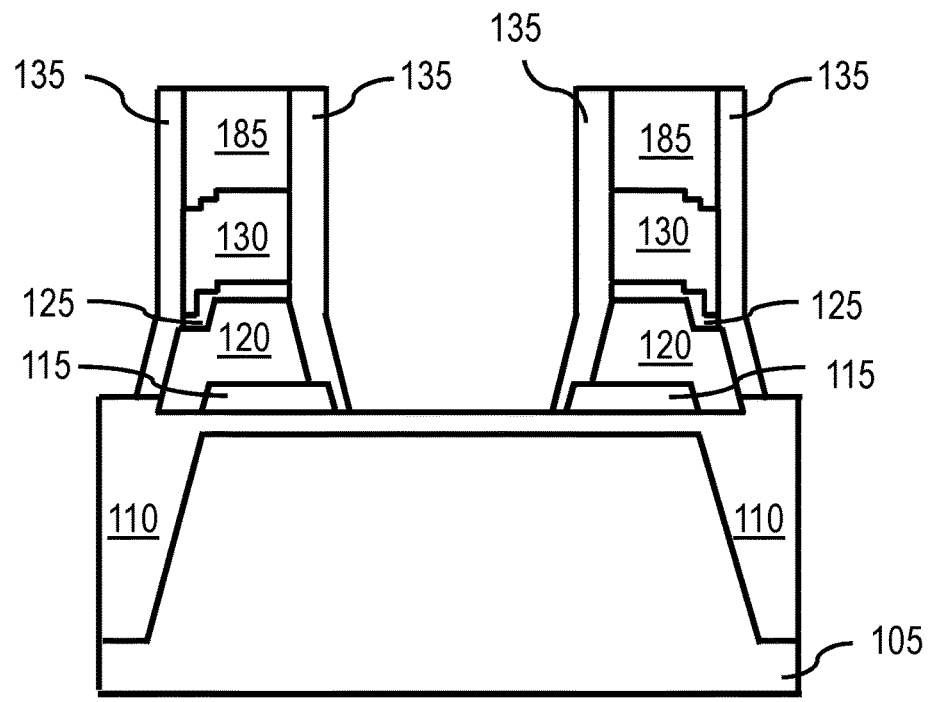

In FIGS. 8 and 9, the first spacer layers 135 are formed. The first spacer layers 135 are in contact with the floating gates 115, control gates 120, first etch stop layer 125, resist protective oxide layer 130, and second hard mask layer 185. The first spacer layers 135 may be formed by performing deposition operation(s) to deposit spacer material followed by etching operation(s) to etch the spacer material such that the first spacer layers 135 remain. The first spacer layers 135 may be made using a variety of materials, such as silicon nitride, silicon dioxide ($SiO_2$), silicon oxynitride (SiON), borosilicate glass (BSG), phosphosilicate glass (PSG), and CVD oxide formed from a tetraethyl orthosilicate (TEOS) source, among other materials of a dielectric nature. A thickness $T_{SP}$ of the first spacer layers 135 may be between about 8 nm and about 14 nm. The second hard mask layer 185 may be utilized to protect underlying layers, such as the resist protective oxide layer 130, from being etched during the formation of the first spacer layers 135. A portion of the second hard mask layer 185 may be etched during the formation of the first spacer layers 135.

Figure 10:
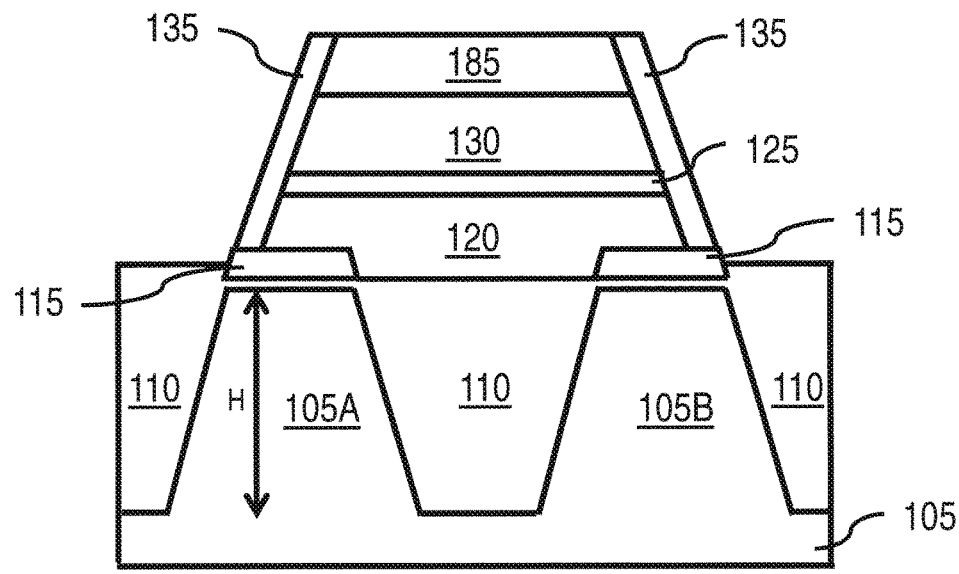
Figure 11:
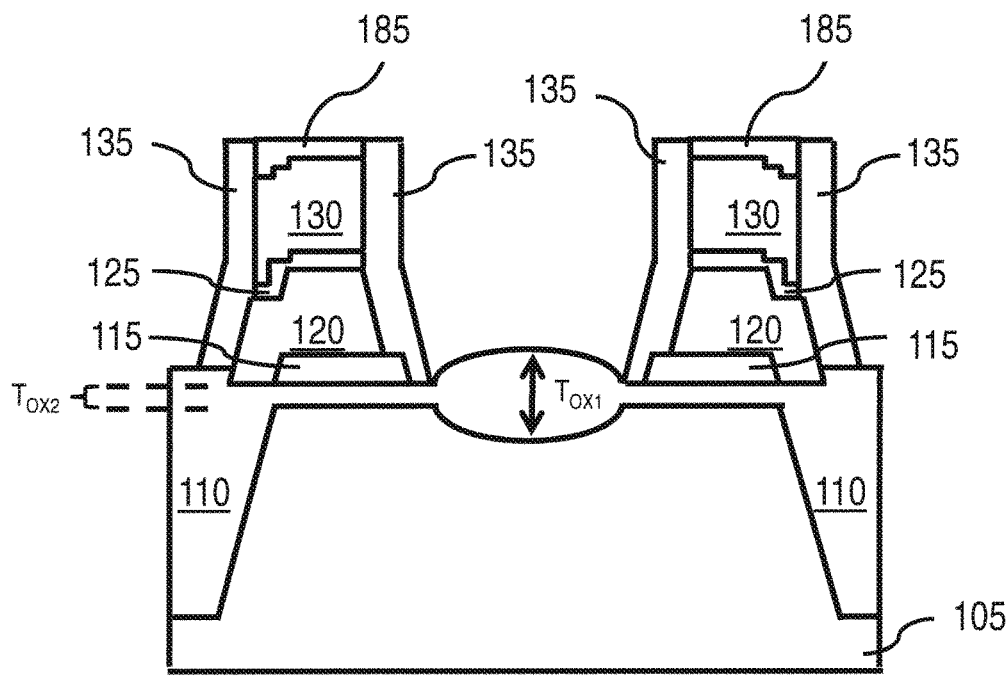

In FIGS. 10 and 11, an implantation operation and an oxidation operation are performed. The implantation operation may be utilized to dope the substrate 105 to form active regions in the substrate 105. The substrate 105 may be doped with phosphorus, arsenic, fluorine, or combinations thereof. The implantation operation may be an ion implantation operation. In some embodiments, the ion implantation operation is a high voltage ion implantation (HVII) operation. The insulation layer 110 may be utilized to define and electrically isolate various active regions. The substrate 105 that is surrounded/separated by the insulation layer 110 is an active region, over which transistors or other semiconductor devices are formed. In FIG. 10, the active regions 105A and 105B are shown. In some embodiments, the height H of the active regions 105A and 105B is between about 80 nm and about 120 nm. In other embodiments, the height H is between about 200 nm and about 400 nm.

In the common source site, in some embodiments, the implantation operation followed by the oxidation operation results in a non-uniform thickness in different portions of the insulation layer 110. In these embodiments, the dopants implanted into the substrate 105 via the implantation operation (e.g., high voltage ion implantation operation) damages the substrate 105, and performing the oxidation operation on the damaged substrate results in the non-uniform thickness of the insulation layer 110. In FIG. 11, a thickness $T_{OX1}$ of a first center portion of the insulation layer 110 is thicker than a thickness $T_{OX2}$ of second end portions of the insulation layer 110 surrounding the first center portion. The thickness $T_{OX1}$ of the first center portion of the insulation layer 110 may be between about 40 nm and about 60 nm. The thickness $T_{OX2}$ of the second end portions of the insulation layer 110 may be between about 10 nm and about 30 nm.

In some embodiments, prior to performing the implantation and oxidation operations, etching operation(s) (e.g., wet etching operation(s)) are performed. The etching operation(s) may etch portions of the first spacer layers 135 and second hard mask layer 185.

Figure 12:
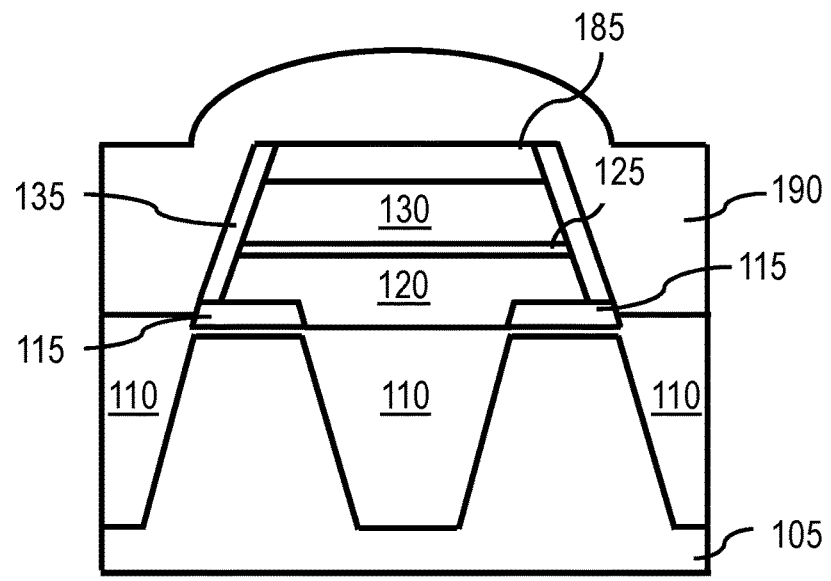
Figure 13:
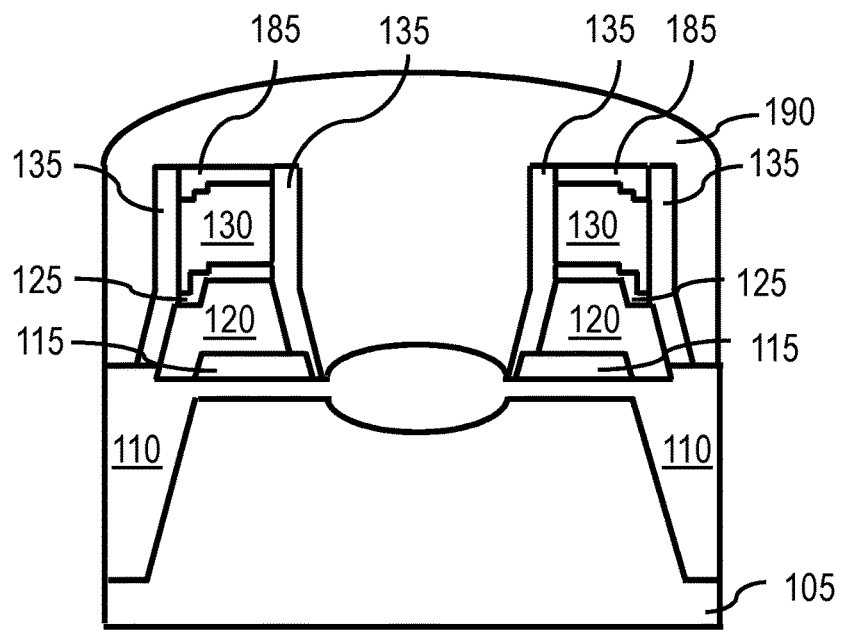

In FIGS. 12 and 13, a polysilicon material 190 is deposited on the insulation layer 110, first spacer layers 135, and second hard mask layer 185. In some embodiments, the polysilicon material 190, when formed, is implanted with a p-type or an n-type impurity, followed by an anneal operation to activate the implanted impurity.

Figure 14:
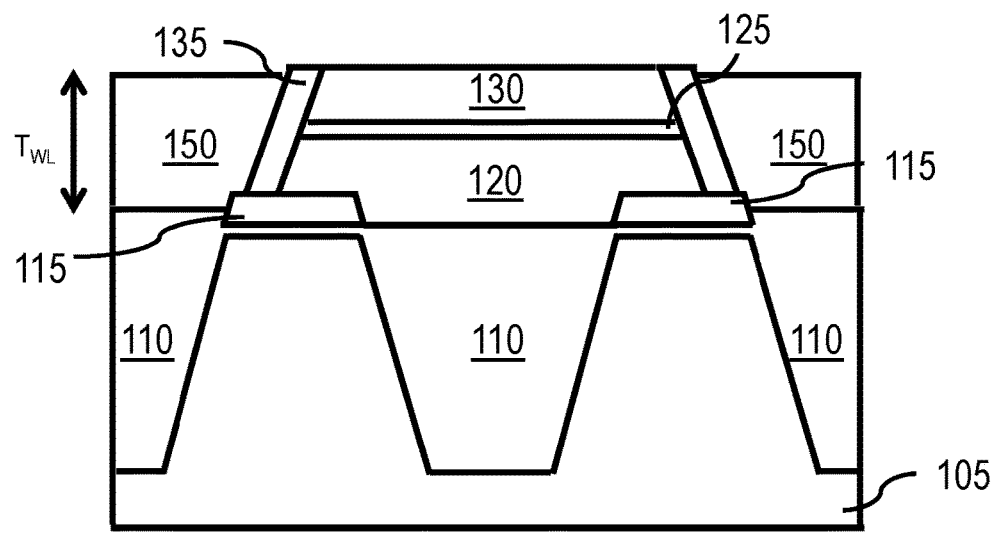
Figure 15:
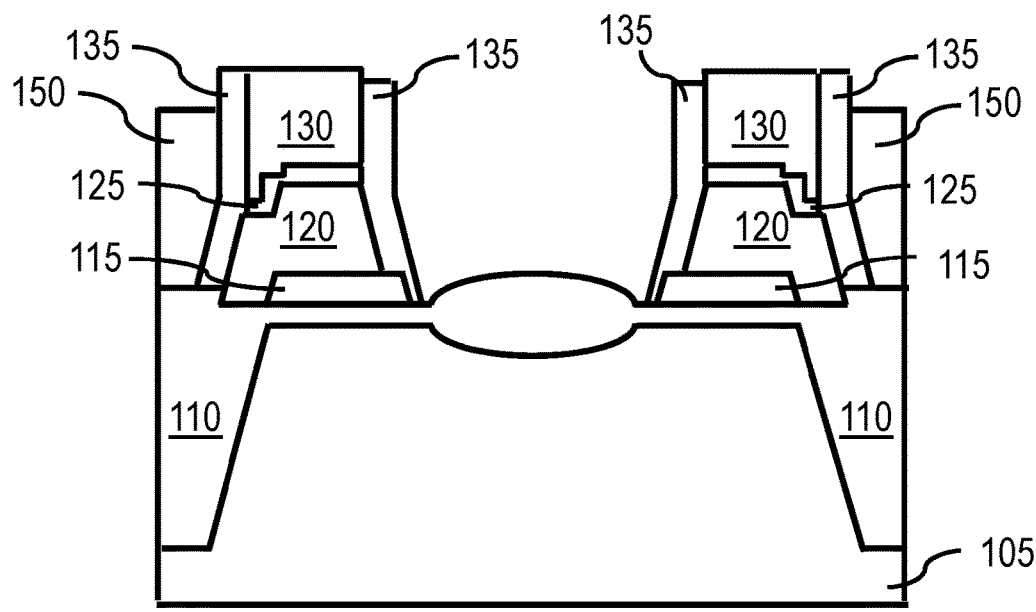

In FIGS. 14 and 15, the wordlines 150 are formed from the polysilicon material 190. In some embodiments, patterning operation(s) and etching operation(s) are performed on the polysilicon material 190 to form the wordlines 150. As shown in FIGS. 14 and 15, the control gates 120 and wordlines 150 are on opposite sides of the first spacer layers 135. The etching operation(s) that are performed to form the wordlines 150 may also etch the first spacer layers 135, first etch stop layer 125, resist protective oxide layer 130, and second hard mask layer 185.

In some embodiments, the wordlines 150 are utilized to allow accessing of the flash memory cell whose cross-sectional views are shown in FIGS. 1A and 1B. Other wordlines (and/or bitlines) may be utilized to access other memory cells of a memory array that includes the flash memory cell. A thickness $T_{WL}$ of the wordlines 150 may be between about 90 nm and about 150 nm.

Figure 16:
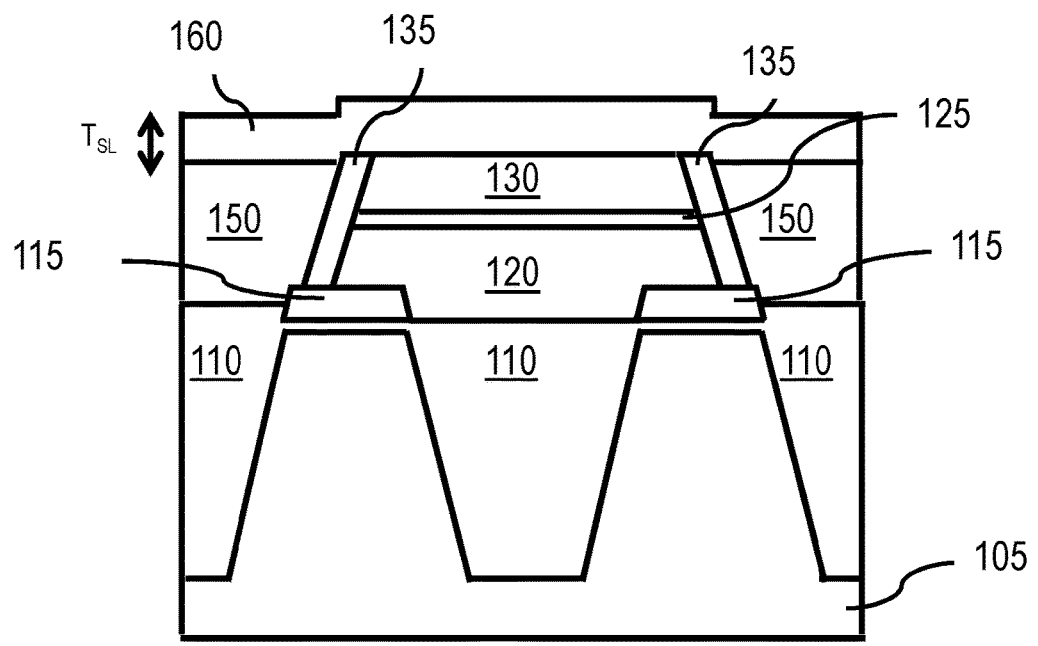
Figure 17:
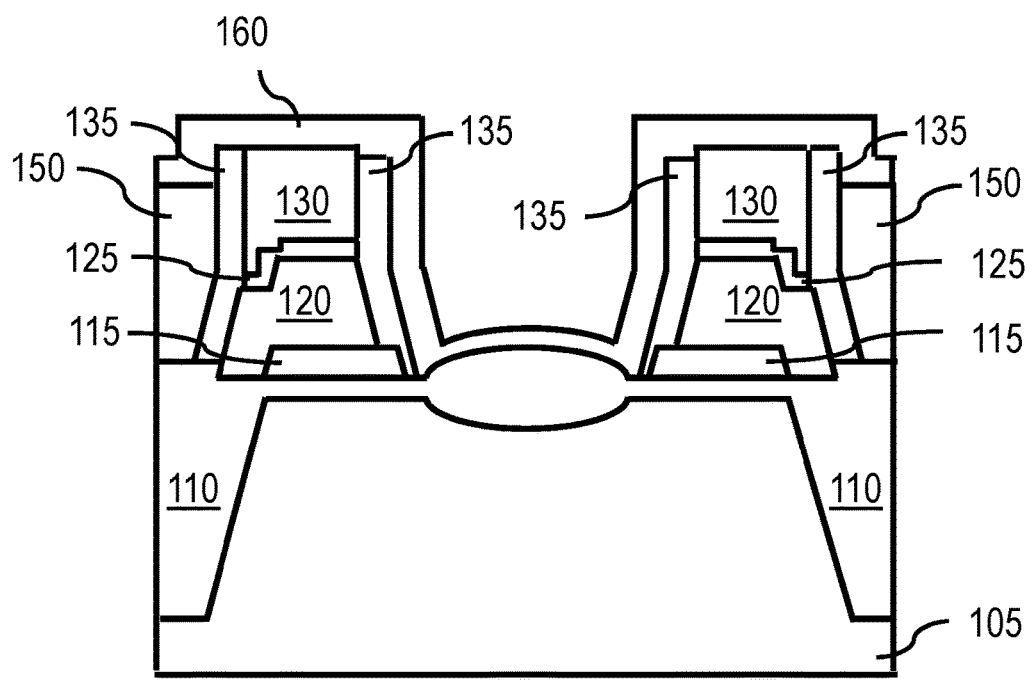

In FIGS. 16 and 17, the second spacer layer 160 is deposited by, for example, performing deposition operations such as chemical vapor deposition (e.g., LPCVD, PECVD, etc.) operations. A thickness $T_{SL}$ of the second spacer layer 160 may be between about 300 Å and about 500 Å. As shown in FIG. 16, on the CG site, the second spacer layer 160 is deposited over and in contact with the resist protective oxide layer 130, first spacer layers 135, and wordlines 150. As shown in FIG. 17, on the CS site, the second spacer layer 160 is deposited over and in contact with the insulation layer 110, resist protective oxide layer 130, first spacer layers 135, and wordlines 150. The second spacer layer 160 includes silicon oxide, silicon nitride, silicon carbide, silicon oxynitride, aluminum oxide, aluminum nitride, aluminum fluoride, titanium nitride, tantalum oxide, magnesium fluoride, titanium silicon nitride, or other suitable etch-stop materials in certain embodiments.

Figure 18:
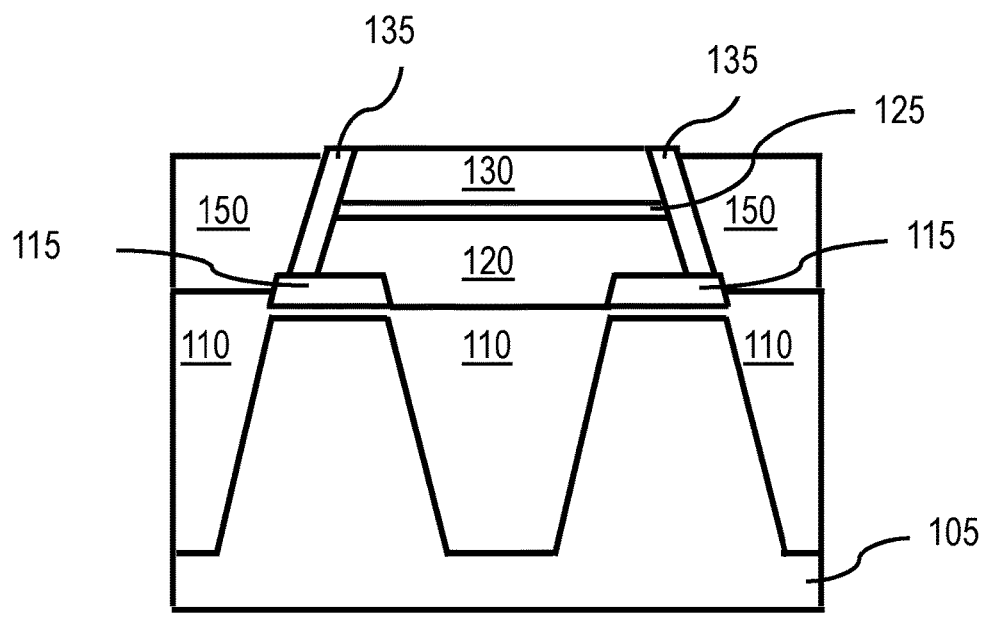
Figure 19:
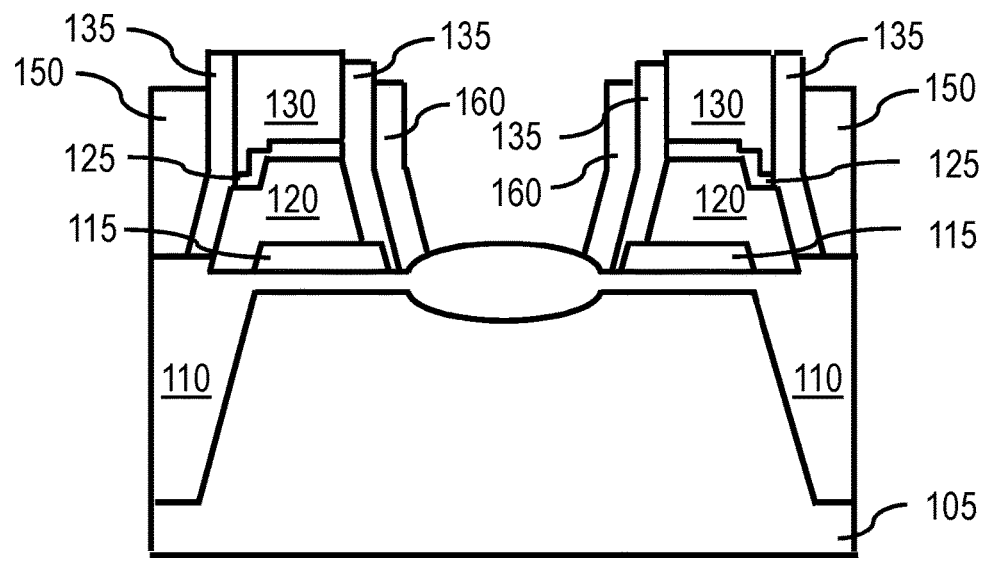

In FIGS. 18 and 19, the second spacer layer 160 is etched. The etching operation may utilize a fluorine-based plasma chemistry. In some embodiments, plasmas containing fluorocarbon-based etch gases, such as tetrafluoromethane ($CF_4$) gas, difluoromethane ($CH_2F_2$) gas, fluoroform ($CHF_3$) gas, hexafluoroethane ($C_2F_6$) gas, and hexafluoropropylene ($C_3F_6$) gas, are utilized to etch the second spacer layer 160. In some cases, additive gases such as $H_2$, $O_2$, and/or argon (Ar) are added to the etch gases. As shown in FIG. 18, the second spacer layer 160 is removed from the CG site. As shown in FIG. 19, on the CS site, the second spacer layer 160 is partially etched so that portions of the second spacer layer 160 remain. In some embodiments, the remaining portions of the second spacer layer 160 cover a sidewall of the first spacer layers 135.

Figure 20:
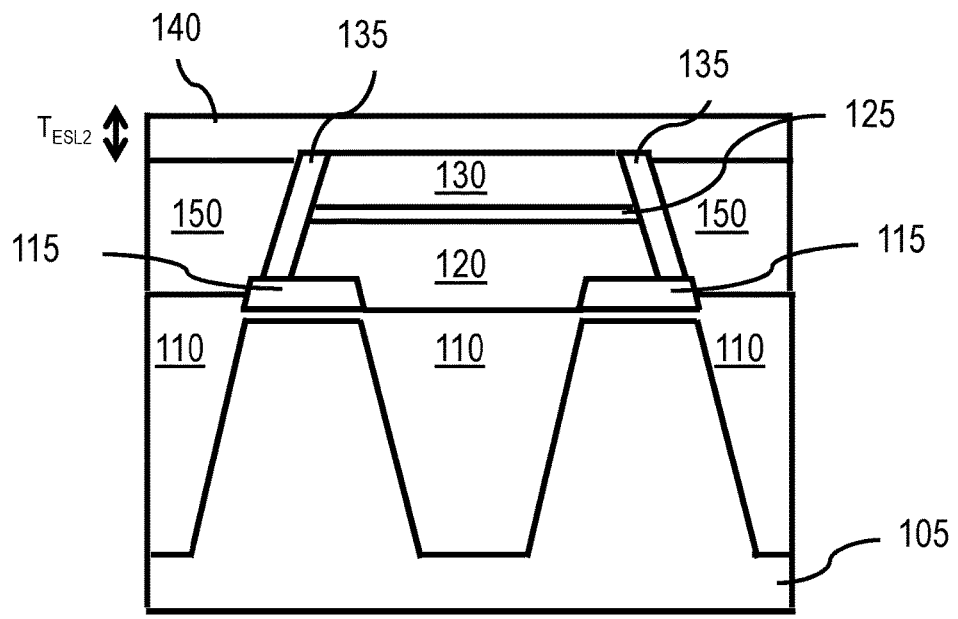
Figure 21:
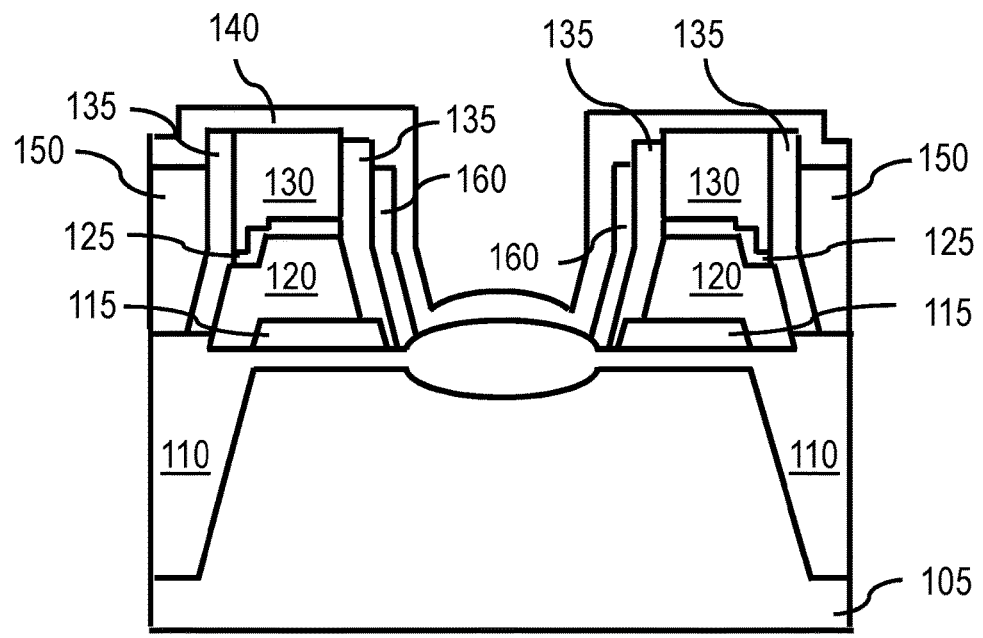

In FIGS. 20 and 21, the second etch stop layer 140 is deposited by, for example, performing deposition operations such as CVD, LPCVD, or PECVD operations. A portion of the second etch stop layer 140 may form a conformal layer over and in contact with a top surface of the insulation layer 110. A thickness $T_{ESL2}$ of the second etch stop layer 140 may be between about 300 Å and about 450 Å. As shown in FIG. 20, on the CG site, the second etch stop layer 140 is deposited over and in contact with the resist protective oxide layer 130, first spacer layers 135, and wordlines 150. As shown in FIG. 21, on the CS site, the second etch stop layer 140 is deposited over and in contact with the resist protective oxide layer 130, first spacer layers 135, second spacer layer 160, insulation layer 110, and wordlines 150. The second etch stop layer 140 may include may include silicon oxide, silicon nitride, silicon carbide, silicon oxynitride, aluminum oxide, aluminum nitride, aluminum fluoride, titanium nitride, tantalum oxide, magnesium fluoride, titanium silicon nitride, or other suitable etch-stop materials. The second spacer layer 160 may be between a portion of the first spacer layers 135 and a portion of the second etch stop layer 140.

Figure 22:
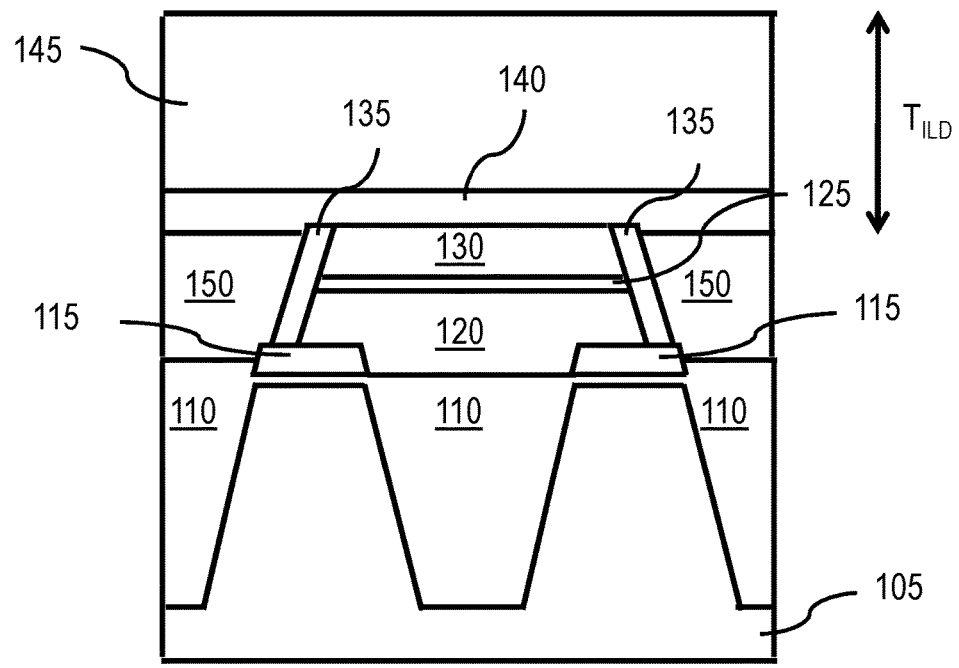
Figure 23:
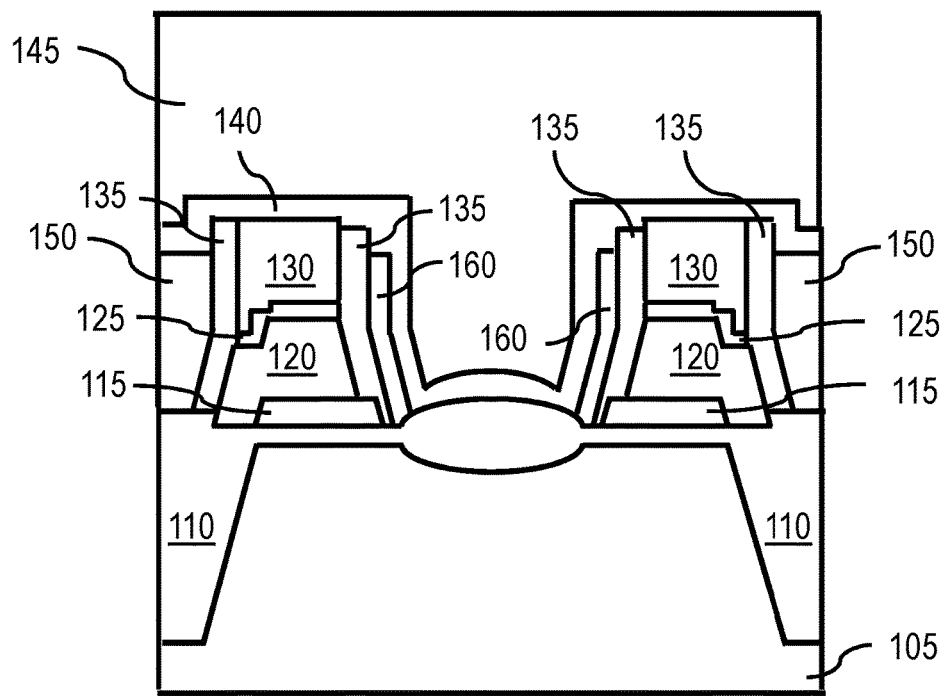

In FIGS. 22 and 23, the interlayer dielectric layer 145 is deposited over the second etch stop layer 140. A thickness $T_{ILD}$ of the interlayer dielectric layer 145 may be between about 230 nm and about 350 nm. The interlayer dielectric layer 145 is made of, for example, one or more layers of a low-k dielectric material. Low-k dielectric materials have a k-value (dielectric constant) lower than about 4.0. In some embodiments, the low-k dielectric materials have a k-value lower than about 3.5, and in other embodiments have a k-value lower than about 2.5. The materials for the interlayer dielectric layer 145 may include compounds comprising Si, O, C and/or H, such as SiCOH and SiOC. Organic material, such as polymers, may be used for the interlayer dielectric layer 145. For example, the interlayer dielectric layer 145 is made of one or more layers of a carbon-containing material, organo-silicate glass, a porogen-containing material, and/or combinations thereof in certain embodiments. Nitrogen is also included in the interlayer dielectric layer 145 in some embodiments. The interlayer dielectric layer 145 may be a porous layer. The density of the interlayer dielectric layer 145 is less than about 3 $g/cm^3$ in one embodiment and is less than about 2.5 $g/cm^3$ in other embodiments. The interlayer dielectric layer 145 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

Figure 24:
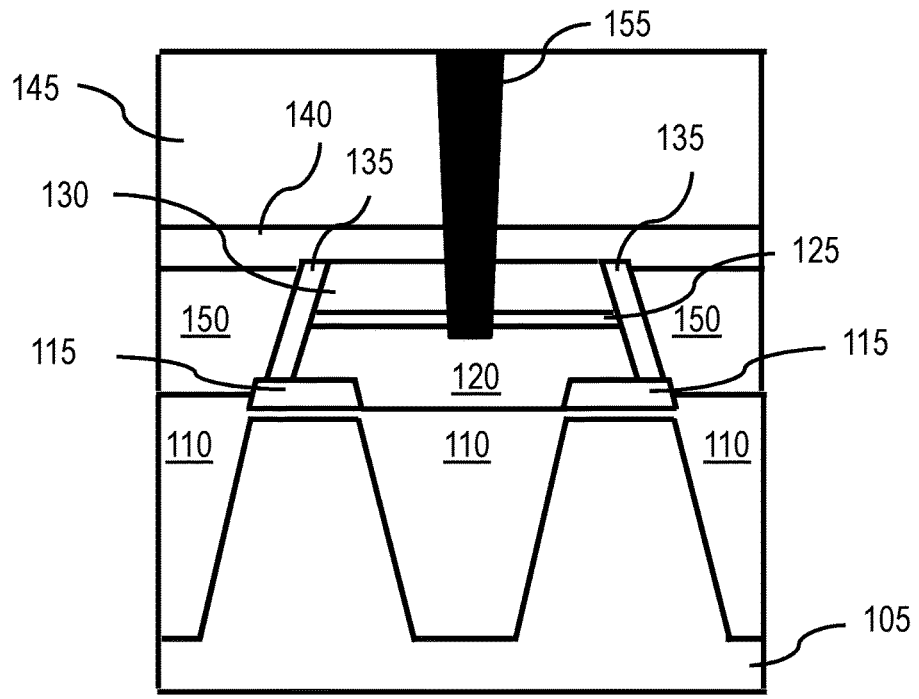
Figure 25:
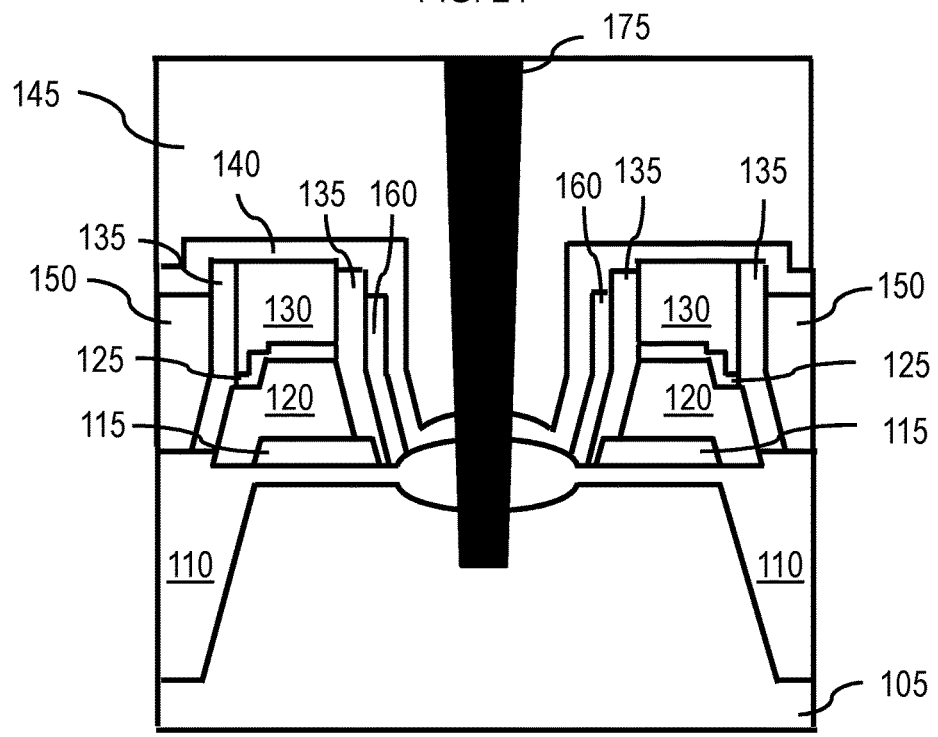

As shown in FIGS. 24 and 25, first and second contacts 155 and 175 are coupled to the control gate site and common source site, respectively, in some embodiments. On the control gate site, a patterning operation (e.g., photolithography) and an etching operation may be performed to etch the interlayer dielectric layer 145, resist protective layer 130, first etch stop layer 125, and control gates 120 in order to form an opening exposing the control gates 120 in which the first contact 155 is subsequently formed. In some embodiments, the first contact 155 is surrounded by and in contact with the interlayer dielectric layer 145, resist protective layer 130, first etch stop layer 125, control gates 120, and substrate 105. In some embodiments, the etching operation successfully etches through these various components due to there being a sufficient liner removal over etching percentage and better oxide to silicon/polysilicon selectivity of the etching operation. The liner removal may involve removing the resist protective oxide layer 130 and the first etch stop layer 125.

On the common source site, a patterning operation and an etching operation may be performed to etch the interlayer dielectric layer 145, second etch stop layer 140, insulation layer 110, and substrate 105 in order to form an opening exposing the substrate 105 in which the second contact 175 is subsequently formed. In some embodiments, the second contact 175 is surrounded by and in contact with the interlayer dielectric layer 145, second etch stop layer 140, insulation layer 110, and substrate 105. The substrate 105 may be doped with phosphorus, arsenic, fluorine, or combination thereof. The etching operation for the control gate site and common source site may utilize fluorocarbon-based etch gases, such as $CF_4$ gas and $C_4F_6$ gas. In some cases, additive gases such as $H_2$, $O_2$, $N_2$, and/or Ar are added to the etch gases.

In some embodiments, a patterning operation includes depositing a resist film (e.g., photoresist), exposing a portion(s) of the resist film (e.g., using an optical lithography tool or electron beam writer), and developing the exposed portion(s) of the resist film to form a resist pattern for an etching operation. The etching operation may include dry etching operations, wet-etching operations, and combinations thereof. For example, a dry etching operation may implement an oxygen-containing gas, fluorine-containing gas (e.g., tetrafluoromethane ($CF_4$), sulfur tetrafluoride ($SF_6$), difluoromethane ($CH_2F_2$), fluoroform ($CHF_3$), and/or hexafluoroethane ($C_2F_6$)), chlorine-containing compound (e.g., $Cl_2$, chloroform ($CHCl_3$), carbon tetrachloride ($CCl_4$), and/or boron trichloride ($BCl_3$)), bromine-containing compound (e.g., hydrogen bromide (HBr) and/or bromoform ($CHBR_3$)), and iodine-containing gas, other suitable gases and/or plasmas, and/or combinations thereof.

In some embodiments, the method of manufacturing the flash memory cell as provided in FIGS. 2-25 is performed with reduced costs and increased efficiency. The reduced costs and increased efficiency may be a result of eliminating operations associated with etching a control gate contact. For instance, the eliminated operations may include, prior to depositing the second spacer layer 160 as shown in FIGS. 16 and 17, performing a photolithography operation on the semiconductor structures of FIGS. 14 and 15, performing an etching operation (e.g., dry etch operation) to etch the control gates 120, first etch stop layer 125, resist protective oxide layer 130, and the insulation layer 110, performing an ash operation, and performing a wafer cleaning operation. By eliminating these operations, the cost and time associated with each of these operations can be avoided.

Furthermore, in some embodiments, the etching operation to etch the control gates 120, first etch stop layer 125, resist protective oxide layer 130, and insulation layer 110 exposes a surface of the control gates 120. On the control gate site, in some cases where the control gates 120 are formed of silicon or polysilicon, a nickel silicide (NiSi) is formed on the surface of the exposed silicon or polysilicon, and the first contact 155 is in contact with the NiSi. On the common source site, in some cases where the substrate 105 is formed of silicon or includes silicon, a nickel silicide (NiSi) is formed on the surface of the exposed substrate, and the second contact 175 is in contact with the NiSi. In contrast, in FIGS. 1A, 1B, and 2-25, the formation of NiSi is avoided.

It will be understood that not all advantages have been necessarily discussed herein, no particular advantage is required for all embodiments or examples, and other embodiments or examples may offer different advantages.

In accordance with one aspect of the present disclosure, a memory device includes a substrate. An insulation layer is disposed in a recess in the substrate. A first gate structure is disposed over the substrate and the insulation layer. A first etch stop layer is disposed over the first gate structure. A first oxide layer is disposed over the first etch stop layer. A second etch stop layer is disposed over the first oxide layer. A first contact material is surrounded by and in contact with the first gate structure, first etch stop layer, second etch stop layer, and first oxide layer.

In accordance with one aspect of the present disclosure, in a method of manufacturing a memory device, a first gate structure is formed over an insulation material and a substrate. A first etch stop layer is formed over the first gate structure. A first oxide layer is formed over the first etch stop layer. A first spacer layer is deposited over the first oxide layer. A first etching operation is performed to etch the first spacer layer. A second etch stop layer is deposited over the first oxide layer. A second etching operation is performed to etch the second etch stop layer and first etch stop layer. A first contact structure is formed such that the first contact structure is in contact with the first gate structure, first oxide layer, first etch stop layer, and second etch stop layer.

In accordance with one aspect of the present disclosure, a memory device includes a substrate. A first oxide layer is disposed over the substrate. A wordline is disposed over the first oxide layer. A first etch stop layer is disposed over the wordline and the first oxide layer. A first gate structure is disposed over the first oxide layer. A first spacer layer is disposed between and in contact with the wordline and the first gate structure. A second spacer layer disposed between the first gate structure and the first etch stop layer. A first contact material is surrounded by and in contact with the first oxide layer and first etch stop layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate;
   an insulation layer disposed in a recess in the substrate;
   a first gate structure disposed over the substrate and the insulation layer;
   a first etch stop layer disposed over the first gate structure;
   a first oxide layer disposed over the first etch stop layer;
   a second etch stop layer disposed over the first oxide layer;
   a first contact material surrounded by and in contact with the first gate structure, first etch stop layer, second etch stop layer, and first oxide layer;
   a wordline disposed over the substrate; and
   a first spacer layer disposed between and in contact with a sidewall of the wordline and a sidewall of the first gate structure.

2. The memory device of claim 1, wherein a portion of the insulation layer is between the substrate and one or more of the wordline, spacer layer, and a portion of the second etch stop layer.

3. The memory device of claim 2, further comprising a second contact material surrounded by the portion of the insulation layer.

4. The memory device of claim 2, further comprising a second contact material surrounded by the substrate.

5. The memory device of claim 1, wherein the first contact material is in contact with the substrate.

6. The memory device of claim 1, further comprising a dielectric layer disposed over the second etch stop layer, wherein the first contact material is surrounded by the dielectric layer.

7. The memory device of claim 6, further comprising
   a second contact material surrounded by and in contact with the second etch stop layer and the dielectric layer.

8. The memory device of claim 1, further comprising a second gate structure disposed over the insulation layer, wherein the first gate structure is disposed over the second gate structure.

9. The memory device of claim 8, wherein the second gate structure comprises two second gate structures spaced apart from each other by a distance of 110 nm to 170 nm.

10. The memory device of claim 8, wherein the first gate structure and the second gate structure comprise polysilicon.

11. The memory device of claim 1, wherein a thickness of the first oxide layer is between 35 nm and 55 nm.

12. A memory device, comprising:
a substrate;
a first oxide layer disposed over the substrate;
a wordline disposed over the first oxide layer;
a first etch stop layer disposed over the wordline and the first oxide layer;
a first gate structure disposed over the first oxide layer;
a first spacer layer disposed between and in contact with the wordline and the first gate structure;
a second spacer layer disposed between the first gate structure and the first etch stop layer; and
a first contact material surrounded by and in contact with the first oxide layer and first etch stop layer,
wherein a portion of the first etch stop layer forms a conformal layer over and in contact with a top surface of the first oxide layer.

13. The memory device of claim 12, wherein the first contact material is surrounded by and in contact with the substrate.

14. The memory device of claim 12, further comprising:
a second etch stop layer disposed over the first gate structure;
a second oxide layer disposed over the second etch stop layer,
wherein the first etch stop layer is disposed over and in contact with the second oxide layer.

15. The memory device of claim 14, further comprising a second contact material surrounded by and in direct contact with the first gate structure.

16. A memory device, comprising:
a substrate;
a first insulation layer disposed over the substrate;
a first gate structure disposed over the first insulation layer;
a second gate structure disposed over the first gate structure;
a first spacer layer disposed on a first sidewall of the first gate structure, a first sidewall of the second gate structure, and a second sidewall of the first gate structure opposing the first sidewall of the first gate structure;
a first etch stop layer disposed over the second gate structure and the first spacer layer;
a wordline disposed on a portion of the first spacer layer disposed on the second sidewall of the first gate structure;
an interlayer dielectric layer disposed over the first etch stop layer;
a first contact material surrounded by and in contact with the interlayer dielectric layer, first insulation layer, and first etch stop layer; and
a second spacer layer disposed between the first etch stop layer and a portion of the first spacer layer disposed on the first sidewall of the first gate structure.

17. The memory device of claim 16, further comprising a second etch stop layer disposed on second gate structure.

18. The memory device of claim 17, further comprising a first oxide layer disposed on the second etch stop layer.

19. The memory device of claim 16, wherein a portion of the first insulation layer is formed in a recess in the substrate.

20. The memory device of claim 16, wherein the first contact material contacts the substrate.

* * * * *